US005482113A

United States Patent [19]
Agonafer et al.

[11] Patent Number: 5,482,113
[45] Date of Patent: Jan. 9, 1996

[54] CONVERTIBLE HEAT EXCHANGER FOR AIR OR WATER COOLING OF ELECTRONIC CIRCUIT COMPONENTS AND THE LIKE

[75] Inventors: Dereje Agonafer; Timothy M. Anderson; Gregory M. Chrysler; Richard C. Chu; Robert E. Simons, all of Poughkeepsie, N.Y.; David T. Vader, Mechanicsburg, Pa.

[73] Assignee: International Business Machines Corporation, Armonk, N.Y.

[21] Appl. No.: 111,755

[22] Filed: Aug. 25, 1993

[51] Int. Cl.⁶ ........................................................ F28F 9/00
[52] U.S. Cl. ............................ 165/137; 165/157; 165/122
[58] Field of Search ................................. 165/157, 137, 165/160, 104.33, 122

[56] References Cited

U.S. PATENT DOCUMENTS 2,134,648  10/1938  Will et al. ........................... 165/122 X
2,391,244  12/1945  Jackson ................................... 165/158
2,731,239   1/1956  Andersen .

FOREIGN PATENT DOCUMENTS 0338343  4/1989  European Pat. Off. .
2138376  7/1971  Germany .
9012199  8/1990  Germany .

Primary Examiner—Albert W. Davis, Jr.
Attorney, Agent, or Firm—Lawrence D. Cutter

[57] ABSTRACT

A heat exchanger, especially for use in conjunction with a wide range of computer systems ranging from work stations to massively parallel processors is employable with both air and water cooling systems. In particular, a heat exchanger is provided which is convertible from a heat sink modality to an air cooling modality and finally to a liquid cooling modality in response to either increased performance demands or an increase in the number of processors or circuit components employed. The conversion may be carried out in the field and provides a flexible and less costly upgradeability path for data processing customers.

10 Claims, 3 Drawing Sheets

CONVERTIBLE HEAT EXCHANGER FOR AIR OR WATER COOLING OF ELECTRONIC CIRCUIT COMPONENTS AND THE LIKE

BACKGROUND OF THE INVENTION

The present invention is generally directed to a heat exchanger which is especially useful for either air or water cooling of electronic circuit components, particularly those used in computer systems. More particularly, the present invention is directed to a flexible heat exchanger which may be employed in a range of computer systems extending from work station devices to massively parallel processing system complexes. Even more particularly, the apparatus of the present invention provides increased thermal flexibility and cooling upgradeability to computer installations at lower cost, with greater reliability and without the necessity of system down time.

It has been the trend in data processing installations to link a number of computer systems together. Typically, these can take the form of a local area network (LAN) to facilitate cooperative work between the users and to ensure the maximum utilization of each computer system. Additionally, in some installations groups of work stations are being linked together to form loosely coupled parallel processing machines. In the limit, large numbers of work station processors may be packaged together to form massively parallel supercomputer systems. It is therefore seen that one of the trends in the computer industry is the combination of sub-assemblies of electronic circuit boards into larger systems. Accordingly, it is seen that it is very desirable *that these sub-assemblies be configured to facilitate their use in work stations, work station clusters and also in massively parallel machines. However, the cooling requirements of these various systems are very different. Nonetheless, it would still be desirable to have a cooling methodology which extends across this whole range of computational devices, which is relatively inexpensive to implement and yet which provides flexible and field upgradeable systems.

One of the possibilities for cooling advanced processors circuit modules is the employment of arrays of parallel plates (fins) which may be employed as heat sinks. Heat generated in an electronic component is conducted into the plates and dissipated through the passage of a forced flow of ambient air within high aspect ratio flow channels between the fins. In future machines, as power levels per module increase, the combined heat dissipated by many machines in a confined workspace, whether they are independent or part of a large LAN, could exceed the capacity of the room air conditioning system in which the systems are placed. In this case it would be desirable if the installation could employ an alternative of a liquid cooling mechanism for these work stations using chilled water from a central Coolant Distribution Module (CDM). The option of air or water cooling for the subassemblies is also desirable for cooling massively parallel machines. In such cases, the cooling demands are often present from the point of initial system installation. However, as the number of processors is expanded even in massively parallel machines it is seen that it is desirable to have flexibility in terms of cooling capacity. While the total heat load generated from smaller machines may well be dissipated into the ambient atmosphere, and eventually controlled by means of building air conditioning systems, the heat load generated by large machines, containing hundreds or even thousands of processor subassemblies packaged into a small volume, would almost certainly be too large (hundreds of kilowatts) to dissipate directly to the room's air environment.

It is also noted that from a thermal perspective fin plates used as heat sinks cannot be simultaneously optimized with both air and water (or other liquid or refrigerant) cooling. This limitation imposes additional constraints upon the design of any computer cooling system which is meant to span a range of system performance levels (work stations at the low end to massively parallel processors at the high end).

Thus, current widespread trends in customer expectations for computing systems include (1) versatility in installation and operating environment, (2) system expandability, (3) maintenance and system modifications performed without loss of system availability, and (4) reduction in the price per unit of computing capacity. Meeting these expectations in future computer installations requires versatile and expandable cooling systems that can be modified in situ to meet the unique requirements of individual customers, both for new installations and of customer environmental requirements as system demands evolve over time.

SUMMARY OF THE INVENTION

In accordance with a preferred embodiment of the present invention a convertible heat exchanger which is especially useful for either the air or liquid cooling of electronic circuit components comprises a base plate and a plurality of liquid flow conduits in fluid communication with manifold means which may be supplied with fluid through the base plate to which the manifold means are preferably mounted. Additionally, a plurality of fins are arranged in parallel with respect to one another. The liquid flow conduits are disposed through the fins with which they are in thermal contact. The fins are also configured so as to define a serpentine liquid flow path in conjunction with a shroud which may be disposed around the fins, manifold means, and conduits, and which may be sealably affixed to the base plate.

The heat exchange mechanism described above is particularly well adapted for conversion to either air or water cooling. The conversion may be made initially when installed at the manufacturing plant or may be field upgraded at a later time in the customer's place of business. The heat exchanger described above is particularly useful in that it may be employed in conjunction with a shroud which is fitted with air moving devices on one or more sides thereof so as to force air between the slots defined by the fin structures. These fin structures are in thermal contact with multiple flow conduits that serve to remove thermal energy from fluid which passes through the conduits and the manifolds.

In addition to being able to receive a shroud which is particularly adaptable for air cooling, the heat exchange of the present invention is also particularly adapted to receive a shroud which provides a water cooling mechanism. In particular, the fins are disposed about the conduits in such a manner so that when used in conjunction with a liquid cooling shroud, there is defined therein a serpentine flow path for a heat exchange fluid such as water.

In operation, it is a simple matter to remove the air flow adapter shroud and to replace it with a liquid flow adapter shroud. In particular the system of the present invention is specifically designed so that this conversion may be performed in the field after a machine has been shipped to a customer and which may even have been in service for some time. The present invention requires minimal disruption to the installation environment.

Accordingly, it is an object of the present invention to provide a convertible heat exchanger for computer systems, thus providing such systems with either an air flow cooling mechanism or a liquid flow cooling mechanism.

It is yet another object of the present invention to provide a single cooling system which may be employed over a large range of computer systems from work stations all the way to large massively parallel processing systems.

It is a still a further object of the present invention to reduce the cost of providing cooling systems to computer customer installations.

It is also an object of the present invention to provide a cooling system having a field upgrade ability without significant increase in system down time for user installations.

It is still another object of the present invention to increase the reliability of computer systems, to improve system performance characteristics, and in fact to increase the possibility of employing the same computer system at higher power levels, as determined, for example, by clock frequency.

Lastly, but not limited hereto, it is an object of the present invention to lower manufacturing costs and to reduce the number of parts employed in a wide range of computer systems.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
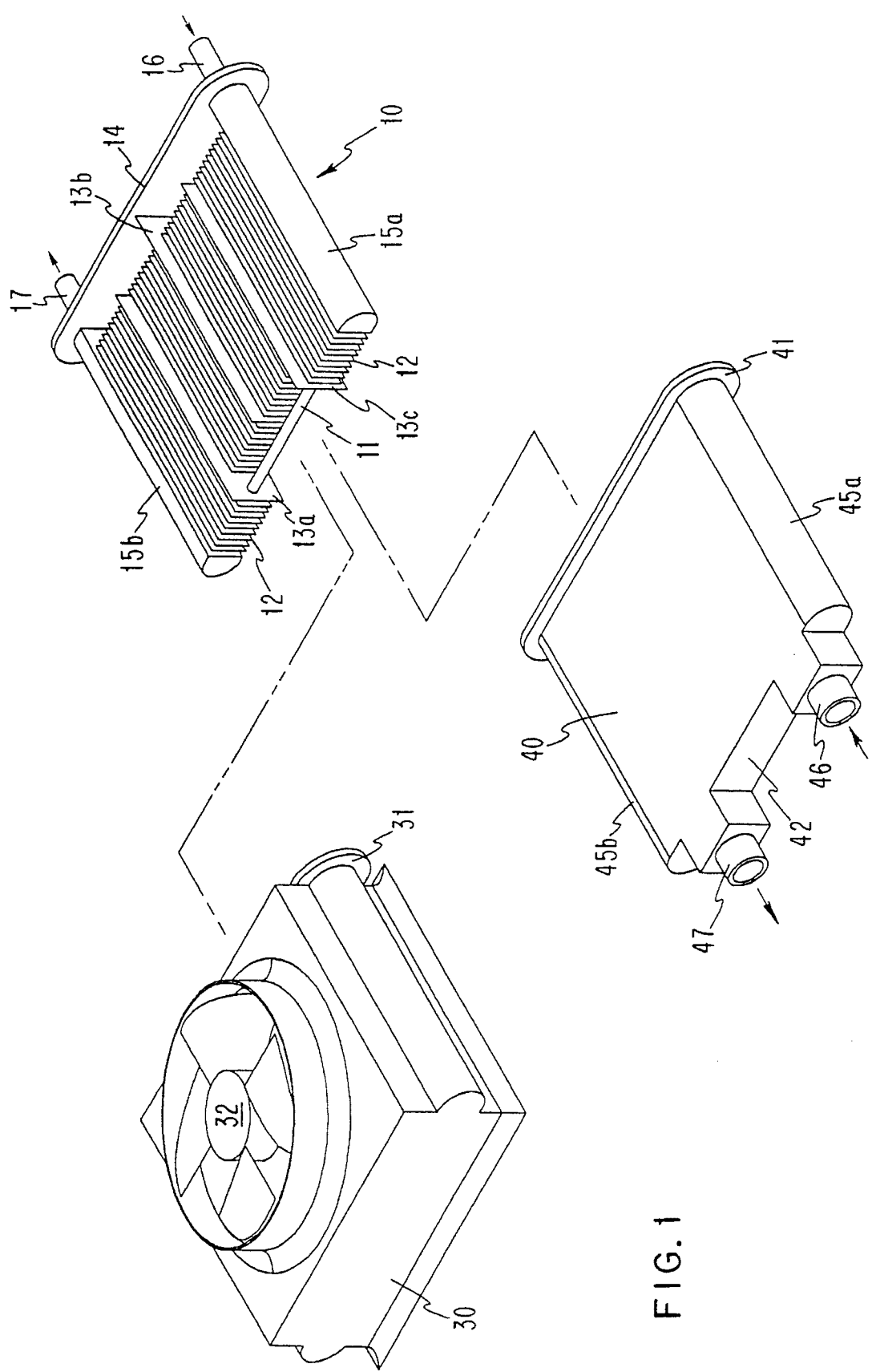
FIG. 1 is an isometric view of the present invention illustrating the convertible heat exchanger and both the air and water cooling jackets or shrouds that may be employed in conjunction therewith.

FIG. 1 illustrates, in isometric view, heat exchanger 10 of the present invention and also illustrates the fact that air cooling shroud 30 or water cooling shroud 40 may be disposed so as to surround the fins 12 in exchanger 10. In fact, fins 12 provide, because of the configuration, not only an air flow path through the fins from one side of heat exchanger 10 to the other, but also provides a liquid flow path through the fin structure in a serpentine manner thus providing a heat exchange mechanism between fluids flowing within flow conduits 11 and the fluid entered to these same conduits. In particular, heat exchanger 10 preferably includes base plate 14 to which manifolds 15a and 15b are mounted. Through base plate 14 there are disposed inlet and outlet connections 16 and 17 respectively to manifolds 15a and 15b respectively. Since base plate 14 does not take an active part in the thermal transfer mechanism of the present invention base plate 14 does not necessarily have to comprise a highly thermally conductive material. In fact, base plate 14 may comprise material such as stainless steel. The same is also true for shrouds 30 and 40. Since these shrouds do not take an active part in the thermal transfer mechanism, they also may comprise a material which is not required to be highly thermally conductive. Thus, shrouds 30 and 40 may also comprise material such as stainless steel. Additionally, because of their function, shrouds 30 and 40 may in fact comprise a material such as a heat resistant plastic such as a polycarbonate. Such shrouds are readily manufacturable using conventional injection molding methods for plastics. This provides an economy of manufacture for the vendor of the computing system and ultimately to the end users thereof.

While fins 12 preferably comprise copper, other materials may be employed if they are compatible with the coolant fluids employed and other metals in the flow system. In particular, sometimes it is possible to employ aluminum for this purpose.

With respect to FIG. 1, it is also noted that there are provided a plurality of fluid flow conduits 11 which extend from inlet manifold 15a to outlet manifold 15b. These flow conduits carry heated liquid, which is to be cooled, from a computer cooling system. In particular, it is noted that conduits 11 are also particularly visible in FIG. 2. There is also provided a plurality of fins 12 which are affixed to flow conduits 11 so as to be in good thermal contact therewith and to provide a large surface area for contact either with ambient air, a directed air stream or a liquid heat exchange fluid. Additionally, of particular import for the present invention there are provided fins 13a, 13b, and 13c. In particular, fins 13a and 13c are positioned so that when shroud 40 is in place with flange 41 sealably affixed against base plate 14, fins 13a and 13c abut against backwall 42 of shroud 40. In a similar fashion, fin 13b is positioned so that it abuts against base plate 14. Thus when shroud 40 is in place, there is defined a serpentine flow path, more particularly visible in FIG. 2. This FIG. 2. This flow path connects inlet 46 in shroud 40 to outlet 47 in shroud 40. However, the presence of fins 13a, 13b, and 13c which are arranged as baffles provide a flow path for the heat exchange fluid which enters inlet 46.

Thus, in one mode of operation heat exchange mechanism 10 may be operated without any shroud in place. This is particularly useful for those situations in which the cooling demand is the least. The next step in the utilization of heat exchanger 10 occurs when a flow of air is directed across fins 12, without any shroud necessarily being in place.

However, a significant advantage of heat exchanger 10 shown in FIG. 1 is that it is readily adaptable for use in conjunction with separate shroud 30 which provides enhanced air cooling capacity. In particular, attention is directed to FIG. 1 in which it is shown that shroud 30 may be disposed so as to surround heat exchanger 10. However, at one end of shroud 30 there is preferably disposed an air moving device 32 comprising, for example, a motor driven fan. Thus, fan 32 provides a forced flow of air through the high aspect ratio fin channels shown in FIG. 1. It is also noted that for purposes of cooling equipment which should exhibit a high degree of reliability, it is preferable to employ dual air moving means substantially in the configuration shown in FIG. 1 except that such means are disposed at both the entrance and the exits of the air flow path. Thus if one air moving mechanism fails, the additional flow demands can be taken up by the second air flow mechanism. The second device is therefore preferably designed so that, by increasing power to that device, the same cooling capacity can be maintained if one of the fan mechanisms fail. Thus blowers are preferably matched in push-pull pairs, one on the upstream side and one on the downstream side of fins 12. This is to ensure high reliability and availability of the cooling system, so as to make the system continuously available. Thus, heat exchanger 10 may be designed to be fully functional with only one blower operational since the operating blower is capable of operating at an increased rate of rotation to compensate for loss of its companion air moving device. Additionally, dual fans provide a means for increasing the flow rate, as for example, when heating requirements change dynamically. Shroud 30 also preferably includes mating plate 31 for attachment of shroud 30 to base plate 14 in a sealable manner. Any conventional method for providing this sealing may be employed.

Figure 2:
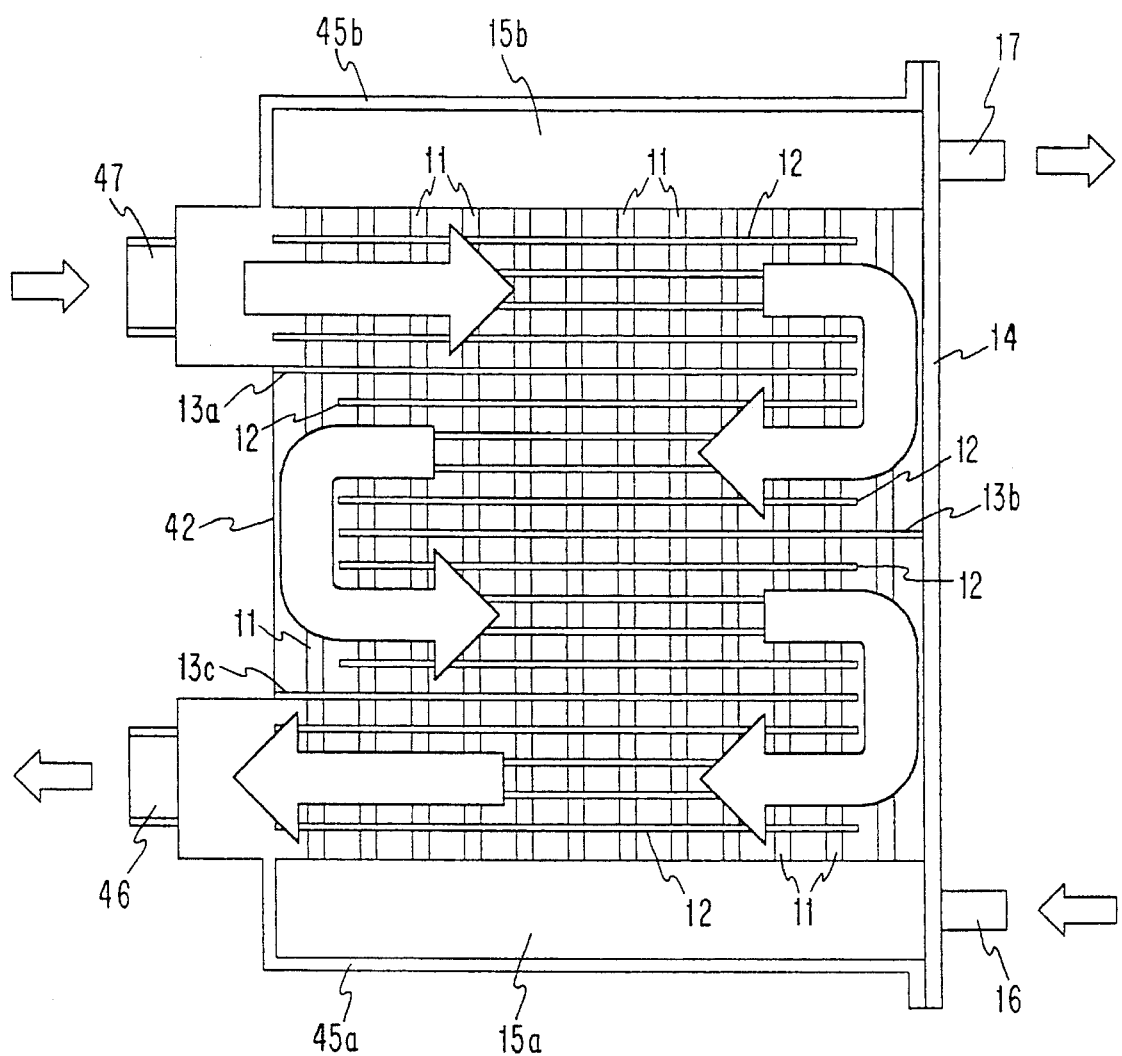
FIG. 2 is a top, partially sectioned view illustrating the use of the water cooling shroud in conjunction with the heat exchanger and more particularly illustrating the presence of a serpentine flow path defined by the fins and the shroud.

Alternatively, a shroud which is particularly useful for providing water cooling may be installed substantially as shown in FIGS. 1 and 2. Shroud 40 surrounds heat exchanger 10 when used in conjunction therewith and preferably includes liquid inlet 46 and liquid outlet 47. Additionally, shroud portions 45a and 45b are particularly shaped and configured to slide over manifolds 15a and 15b respectively. This further helps to define the liquid flow path. Shroud 40 is also fitted with flange 41 which is sealably engaged with base plate 14, again using any conventional sealing arrangement that is desired. In particular, gaskets and seals may be employed with clamps, bolts or other fastening mechanisms.

It is noted that since the cooling function is essentially accomplished by means of flow conduits 11 and fins 12, shrouds 30 and 40 may in fact comprise polymeric materials. Such material might in fact include plastic such as a polycarbonate. This means that the shell or shroud itself may be made of a lightweight non-conductor by conventional low cost methods used in mass production, including injection molding. Interior surfaces of the shroud, in the presence of fins or baffles 13a, 13b and 13c provide multiple serial flow passages through heat exchanger 10.

Figure 3:
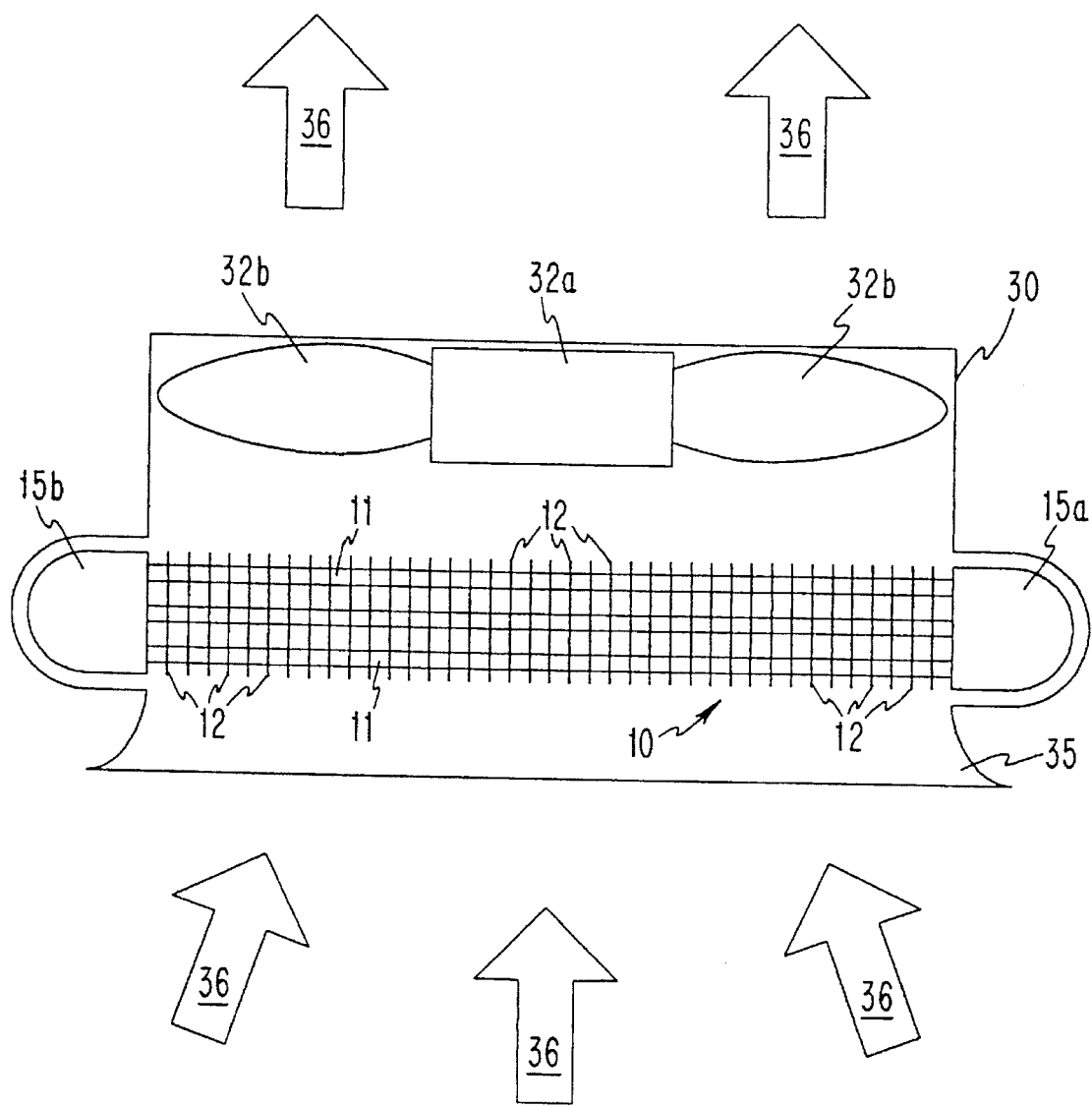
FIG. 3 is a cross sectional view illustrating the use of the air cooling shroud in conjunction with an air moving device and the heat exchanger and manifolds of the present invention.

One embodiment of the present invention is also particularly illustrated in FIG. 3. This figure illustrates in cross-sectional fashion the arrangement present when air cooling shroud 30 is employed in conjunction with heat exchange mechanism 10. Flow arrows 36 indicate the direction in which air is caused to flow through the fins 12. In particular, it is seen that fan motor 32a drives blades 32b to provide the desired air motion. In this particular embodiment it is noted that shroud 30 is provided with flared entry portion 35 to ensure the flow of a sufficiently large volume of air through heat exchanger 10.

In the preferred embodiments of the present invention fins 12 preferably comprise copper. Base plate 14 may also comprise copper but it is noted that copper is less desirable for this purpose because of its relative softness. However, in general, it is preferable that flow containing portions preferably comprise the same metal to alleviate the problems of galvanic corrosion.

A description of how the present invention may be employed is now provided. In particular, it is noted that the heat exchanger of the present invention can be converted in situ (i.e., in the field) to (1) dissipate heat to ambient air directly, (2) to serve as the evaporator of a refrigerator, so that lower cold-side temperatures may be achieved while still dissipating heat to ambient air, or (3) to permit heat dissipation to customer supplied (building) chilled water. The heat exchanger may, for example, be part of a Coolant Distribution Unit (CDU) for a computer system. The system coolant, such as water or fluorocarbon, returns from the circuit heat load(s) and flows into manifold 15a for distribution to tube bank 11 which is the warm-side of the heat exchanger. The coolant flows through the tubes and heat is rejected to the cold-side of the heat exchanger. Finally, coolant is collected in downstream manifold 15b, from which it can be returned to the computer system or other electronic components which are being cooled.

Plate-like fins 12 span the tubes in the tube bank, as seen in FIGS. 1 and 2, and serve to enhance cold-side heat dissipation. These fins may be attached to the tubes by conventional press fit or braze processes. Press fit attachment of fins is common for cold-side air cooling, which is convection limited. A braze attachment is preferred in this invention, since the tube-to-fin contact resistance to heat flow may be prohibitive when liquid cooling from the cold-side is implemented.

Some customers, however, may not have sufficient room air conditioning capacity to handle the computer heat load that is dissipated through an air cooled heat exchanger. In this case, the air cooling shroud is replaced with a water cooling shroud enclosure 40, which becomes the shell in a shell-and-tube heat exchanger. Heat is dissipated from this to customer supplied chilled water or other heat sink mechanism. Since the enclosure itself does not participate directly in cooling, the shell may be made of a lightweight thermally nonconductive material such as plastic. Interior surfaces of the shell, and the presence of the fins on the tube bank form multiple flow passes through the heat exchanger. FIG. 3, in particular, illustrates an example of a 4-pass heat exchange arrangement. Some customers may start out with an air cooled Coolant Distribution Unit, and later expand their computing system so that the heat load increases beyond the capacity of the air cooled system and/or the capacity of the room air conditioning system. In such a case, a field engineer may easily remove air cooling shroud 30 at the customer's site, and replace it with higher capacity water cooling shell 40.

A third type of customer may prefer an air cooled Coolant Distribution Unit, but not be able to achieve adequate cooling with a blower shroud. This could be for one of several reasons: (1) the customer may have a larger heat load (more computing capacity) than can be handled by direct air conditioning; (2) ambient air conditions in the customer's work place may not permit direct air cooling (e.g. temperature, humidity, and/or elevation is too high); or (3) the customer may own a computer which requires lower coolant temperatures than can be achieved with direct air cooling. In this case, shell 40 surrounding the core of heat exchanger 10 becomes the evaporator for a refrigeration system which increases the system capacity and/or lowers the temperature, while continuing to dissipate heat to room air. As with the air cooled shroud and water cooled shell, the refrigeration option may be factory or field installed.

From a thermal perspective, the bank of tubes 11 and fins 12 cannot be simultaneously optimized for air cooling, water cooling and/or for service as an evaporator. The advantages of the present invention, however, lie in meeting the unique customer demands that are rapidly emerging in the computer industry. Field Convertible Cooling (FCC) permits a versatile and expandable Coolant Distribution Unit (CDU) to be built. A single CDU design can span many machines and environmental requirements, and can readily accommodate the expansion of a customer's facilities. Typical expansions include an upgrade to a more powerful processor, to multi-processors, to a new machine, or to the implementation of multiple machines in a single facility. This flexibility reduces part numbers for the manufacturer, thereby reducing both development and manufacturing costs. Customer cost is also reduced, since expansion can be accomplished without purchasing a new CDU, and via manufacturer savings passed on to the customer. Field Convertible Cooling, as described herein, also accommodates the demand for continuous availability of computing facilities. FCC heat exchangers are, in accordance with the present invention, field modifiable, without breaking into the machine-side coolant. Moreover, the machine-side coolant may continue to flow while FCC modifications are made. By implementing two FCC heat exchangers in a CDU, computing facilities may continue to dissipate heat through one FCC unit, while the other is being modified. Accordingly, it is seen that the present invention meets all of the above stated objectives.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A convertible heat exchanger, especially for air or liquid cooling of electronic circuit components, said heat exchanger comprising:

a base plate;

a plurality of liquid flow conduits in fluid flow communication with inlet and outlet manifold means with fluid being suppliable to and withdrawable from said inlet and outlet manifold means through said base plate; and a plurality of fins arranged in parallel with respect to one another and through which said liquid flow conduits pass and with which said fins are in thermal contact, said fins also being configured in a staggered pattern so as to at least partially define a serpentine liquid flow path when employed in conjunction with a shroud which completes said flow path definition and which may be disposed around said fins and said conduits, said shroud being sealably affixable to said base plate.

2. The heat exchanger of claim 1 further including an air or gaseous flow cooling adaptor which comprises a shroud which is disposed at least partially around said conduits and said fins, such shroud including air moving means on one side of said shroud, such shroud being disposed so as to supply a gaseous flow through said fins and across said conduits and out of the opposite side of said shroud.

3. The heat exchanger of claim 2 in which said shroud includes a flat mating portion which is sealably affixed to said base plate.

4. The heat exchanger of claim 2 in which said air moving means comprises a fan.

5. The heat exchanger of claim 2 in which there is present a second air moving means at the opposite side of said shroud from said first air moving means, whereby operational reliability is enhanced via air moving means redundancy or whereby higher air flow rates may be provided.

6. The heat exchanger of claim 2 in which said shroud comprises a polymeric material.

7. The heat exchanger of claim 1 further including a liquid flow cooling adaptor which comprises a shroud which is sealably disposed against said base plate and which surrounds said fins and said liquid flow conduits, said shroud defining, in conjunction with said base plate and said fins, a serpentine liquid flow path substantially parallel to said fins and across said conduits.

8. The shroud of claim 7 in which said shroud comprises a polymeric material.

9. The heat exchanger of claim 1 further including means for causing fluid to flow between or through said fins.

10. The heat exchanger of claim 1 in which said fins comprise copper.

* * * * *